(12) United States Patent
Chau et al.

(10) Patent No.: US 7,078,296 B2
(45) Date of Patent: Jul. 18, 2006

(54) SELF-ALIGNED TRENCH MOSFETS AND METHODS FOR MAKING THE SAME

(75) Inventors: Duc Chau, San Jose, CA (US); Becky Losee, Cedar Hills, UT (US); Bruce Marchant, Murray, UT (US); Dean Probst, West Jordan, UT (US); Robert Herrick, Lehi, UT (US); James Murphy, South Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/052,234

(22) Filed: Jan. 16, 2002

(65) Prior Publication Data

US 2003/0132480 A1    Jul. 17, 2003

(51) Int. Cl.
*H01L 21/8232* (2006.01)
(52) U.S. Cl. .................. 438/270; 438/589; 438/667; 438/675; 438/695; 438/700; 438/760
(58) Field of Classification Search ............... 438/242, 438/361, 589, 667, 672, 675, 695, 700, 760, 438/259, 270, FOR. 118, FOR. 189, FOR. 388, 438/702, 703, 791
See application file for complete search history.

(56) References Cited

U.S. PATENT DOCUMENTS

| | | | | |
|---|---|---|---|---|
| 4,070,690 | A | 1/1978 | Wickstrom | 357/68 |
| 4,084,311 | A | 4/1978 | Yasuoka et al. | 29/571 |
| 4,132,998 | A | 1/1979 | Dingwall | 357/23 |
| 4,138,649 | A | 2/1979 | Schaffer | 330/9 |
| 4,145,703 | A | 3/1979 | Blanchard et al. | 357/55 |
| 4,221,044 | A | 9/1980 | Godejahn, Jr. et al. | 29/571 |
| 4,221,045 | A | 9/1980 | Godejahn, Jr. | 29/571 |
| 4,264,376 | A | 4/1981 | Yatsuda et al. | 148/1.5 |
| 4,277,881 | A | 7/1981 | Godejahn, Jr. | 29/571 |
| 4,324,038 | A | 4/1982 | Chang et al. | 29/571 |
| 4,326,332 | A | 4/1982 | Kenney | 29/571 |
| 4,329,705 | A | 5/1982 | Baker | 357/43 |
| 4,344,081 | A | 8/1982 | Pao et al. | 357/43 |
| 4,345,265 | A | 8/1982 | Blanchard | 357/23 |
| 4,382,827 | A | 5/1983 | Romano-Moran et al. | 148/1.5 |
| 4,398,339 | A | 8/1983 | Blanchard et al. | 29/571 |

(Continued)

FOREIGN PATENT DOCUMENTS

CN     1 036 666     10/1989

(Continued)

OTHER PUBLICATIONS

U.S. Appl. No. 08/970,221, filed Nov. 14, 1997.

(Continued)

*Primary Examiner*—George Fourson
*Assistant Examiner*—Joannie Adelle García
(74) *Attorney, Agent, or Firm*—Kenneth E. Horton; Kirton & McConkie

(57) ABSTRACT

Self-aligned trench MOSFETs and methods for manufacturing the same are disclosed. By having a self-aligned structure, the number of MOSFETS per unit area—the cell density—is increased, making the MOSFETs cheaper to produce. The self-aligned structure for the MOSFET is provided by making the sidewall of the overlying isolation dielectric layer substantially aligned with the sidewall of the gate conductor. Such an alignment can be made through any number of methods such as using a dual dielectric process, using a selective dielectric oxidation process, using a selective dielectric deposition process, or a spin-on-glass dielectric process.

24 Claims, 10 Drawing Sheets

U.S. PATENT DOCUMENTS

| | | | |
|---|---|---|---|
| 4,419,809 A | 12/1983 | Riseman et al. | 29/571 |
| 4,424,621 A | 1/1984 | Abbas et al. | 29/571 |
| 4,441,247 A | 4/1984 | Gargini et al. | 29/571 |
| 4,452,354 A | 6/1984 | Tabachnick | 206/5 |
| 4,455,737 A | 6/1984 | Godejahn, Jr. | 29/571 |
| 4,466,172 A | 8/1984 | Batra | 29/571 |
| 4,500,898 A | 2/1985 | Cline | 357/23 |
| 4,503,449 A | 3/1985 | David et al. | 357/23.4 |
| 4,503,598 A | 3/1985 | Vora et al. | 29/571 |
| 4,503,601 A | 3/1985 | Chiao | 29/571 |
| 4,541,001 A | 9/1985 | Schutten et al. | 357/23.4 |
| 4,560,975 A | 12/1985 | Jarva | 340/347 |
| 4,568,958 A | 2/1986 | Baliga | 357/23.4 |
| 4,577,391 A | 3/1986 | Hsia et al. | 29/571 |
| 4,579,621 A | 4/1986 | Hine | 156/612 |
| 4,590,458 A | 5/1986 | Evans et al. | 340/347 |
| 4,593,453 A | 6/1986 | Tam et al. | 29/571 |
| 4,599,789 A | 7/1986 | Gasner | 29/571 |
| 4,607,270 A | 8/1986 | Iesaka | 357/15 |
| 4,638,344 A | 1/1987 | Cardwell, Jr. | 357/22 |
| 4,639,762 A | 1/1987 | Neilson et al. | 357/23.8 |
| 4,673,962 A | 6/1987 | Chatterjee et al. | 357/23.6 |
| 4,682,405 A | 7/1987 | Blanchard et al. | 29/571 |
| 4,683,643 A | 8/1987 | Nakajima et al. | 437/203 |
| 4,698,653 A | 10/1987 | Cardwell, Jr. | 357/22 |
| 4,701,423 A | 10/1987 | Szluk | 437/57 |
| 4,716,126 A | 12/1987 | Cogan | 437/24 |
| 4,745,079 A | 5/1988 | Pfiester | 437/29 |
| 4,746,630 A | 5/1988 | Hui et al. | 437/235 |
| 4,752,813 A | 6/1988 | Bhatia et al. | 357/15 |
| 4,754,310 A | 6/1988 | Coe | 357/13 |
| 4,760,033 A | 7/1988 | Mueller | 438/231 |
| 4,767,722 A | 8/1988 | Blanchard | 437/41 |
| 4,774,556 A | 9/1988 | Fujii et al. | 357/23.5 |
| 4,808,543 A | 2/1989 | Parrillo et al. | 437/38 |
| 4,811,065 A | 3/1989 | Cogan | 357/23.4 |
| 4,824,793 A | 4/1989 | Richardson et al. | 437/47 |
| 4,845,537 A | 7/1989 | Nishimura et al. | 357/23.4 |
| 4,853,345 A | 8/1989 | Himelick | 437/41 |
| 4,860,072 A | 8/1989 | Zommer | 357/23.8 |
| 4,881,105 A | 11/1989 | Davari et al. | 357/23.4 |
| 4,893,160 A | 1/1990 | Blanchard | 357/23.4 |
| 4,903,189 A | 2/1990 | Ngo et al. | 363/127 |
| 4,912,061 A | 3/1990 | Nasr | 437/44 |
| 4,914,058 A | 4/1990 | Blanchard | 437/203 |
| 4,941,026 A | 7/1990 | Temple | 357/23.4 |
| 4,946,799 A | 8/1990 | Blake et al. | 437/41 |
| 4,956,308 A | 9/1990 | Griffin et al. | 437/41 |
| 4,961,100 A | 10/1990 | Baliga et al. | 357/39 |
| 4,967,245 A | 10/1990 | Cogan et al. | 357/23.4 |
| 4,983,535 A | 1/1991 | Blanchard | 437/40 |
| 4,990,463 A | 2/1991 | Mori | 437/52 |
| 4,992,390 A | 2/1991 | Chang | 437/42 |
| 5,016,068 A | 5/1991 | Mori | 357/23.5 |
| 5,017,504 A | 5/1991 | Nishimura et al. | 437/40 |
| 5,021,846 A | 6/1991 | Ueno | 357/23.4 |
| 5,034,785 A | 7/1991 | Blanchard | 257/330 |
| 5,045,900 A | 9/1991 | Tamagawa | 357/23.4 |
| 5,065,273 A | 11/1991 | Rajeevakumar | 361/313 |
| 5,071,782 A | 12/1991 | Mori | 437/48 |
| 5,072,266 A | 12/1991 | Bulucea et al. | 357/23.4 |
| 5,111,253 A | 5/1992 | Korman et al. | 357/15 |
| 5,124,764 A | 6/1992 | Mori | 357/23.4 |
| 5,134,448 A | 7/1992 | Johnsen et al. | 357/23.4 |
| 5,156,989 A | 10/1992 | Williams et al. | 437/41 |
| 5,160,491 A | 11/1992 | Mori | 437/40 |
| 5,164,325 A | 11/1992 | Cogan et al. | 437/29 |
| 5,164,327 A | 11/1992 | Maruyama | 437/40 |
| 5,168,331 A | 12/1992 | Yilmaz | 257/331 |
| 5,169,796 A | 12/1992 | Murray et al. | 437/41 |
| 5,177,572 A | 1/1993 | Murakami | 257/260 |
| 5,188,973 A | 2/1993 | Omura et al. | 437/40 |
| 5,208,657 A | 5/1993 | Chatterjee et al. | 257/302 |
| 5,216,275 A | 6/1993 | Chen | 257/493 |
| 5,219,793 A | 6/1993 | Cooper et al. | 437/195 |
| 5,242,845 A | 9/1993 | Baba et al. | 437/40 |
| 5,250,450 A | 10/1993 | Lee et al. | 437/40 |
| 5,273,922 A | 12/1993 | Tsoi | 437/41 |
| 5,275,961 A | 1/1994 | Smayling et al. | 437/41 |
| 5,275,965 A | 1/1994 | Manning | 437/67 |
| 5,281,548 A | 1/1994 | Prall | 437/43 |
| 5,294,824 A | 3/1994 | Okada | 257/409 |
| 5,298,442 A | 3/1994 | Bulucea et al. | 437/40 |
| 5,298,780 A | 3/1994 | Harada | 257/330 |
| 5,298,781 A | 3/1994 | Cogan et al. | 257/333 |
| 5,300,447 A | 4/1994 | Anderson | 437/41 |
| 5,300,452 A | 4/1994 | Chang et al. | 437/126 |
| 5,304,831 A | 4/1994 | Yilmaz et al. | 257/341 |
| 5,316,959 A | 5/1994 | Kwan et al. | 437/40 |
| 5,326,711 A | 7/1994 | Malhi | 437/33 |
| 5,341,011 A | 8/1994 | Hshieh et al. | 257/330 |
| 5,346,834 A | 9/1994 | Hisamoto et al. | 437/41 |
| 5,350,937 A | 9/1994 | Yamazaki et al. | 257/316 |
| 5,365,102 A | 11/1994 | Mehrotra et al. | 257/475 |
| 5,366,914 A | 11/1994 | Takahashi et al. | 437/41 |
| 5,389,570 A | 2/1995 | Shiozawa | 437/101 |
| 5,399,513 A | 3/1995 | Liou et al. | 437/34 |
| 5,405,794 A | 4/1995 | Kim | 437/41 |
| 5,410,170 A | 4/1995 | Bulucea et al. | 257/332 |
| 5,420,452 A | 5/1995 | Tran et al. | 257/428 |
| 5,424,231 A | 6/1995 | Yang | 437/40 |
| 5,429,977 A | 7/1995 | Lu et al. | 437/52 |
| 5,430,324 A | 7/1995 | Bencuya | 257/495 |
| 5,432,105 A | 7/1995 | Chien | 437/34 |
| 5,438,007 A | 8/1995 | Vinal et al. | 437/41 |
| 5,438,215 A | 8/1995 | Tihanyi | 257/401 |
| 5,455,190 A | 10/1995 | Hsu | 437/40 |
| 5,468,982 A | 11/1995 | Hshieh et al. | 257/331 |
| 5,472,887 A | 12/1995 | Hutter et al. | 437/34 |
| 5,473,176 A | 12/1995 | Kakumoto | 257/192 |
| 5,473,180 A | 12/1995 | Ludikhuize | 257/336 |
| 5,474,943 A | 12/1995 | Hshieh et al. | 437/40 |
| 5,488,010 A | 1/1996 | Wong | 437/53 |
| 5,508,534 A | 4/1996 | Nakamura et al. | 257/135 |
| 5,514,608 A | 5/1996 | Williams et al. | 437/44 |
| 5,532,179 A | 7/1996 | Chang et al. | 437/40 |
| 5,541,425 A | 7/1996 | Nishihara | 257/139 |
| 5,547,895 A | 8/1996 | Yang | 437/57 |
| 5,554,552 A | 9/1996 | Chi | 437/43 |
| 5,554,862 A | 9/1996 | Omura et al. | 257/137 |
| 5,558,313 A | 9/1996 | Hshieh et al. | 257/342 |
| 5,567,634 A | 10/1996 | Hebert et al. | 437/41 |
| 5,576,245 A | 11/1996 | Cogan et al. | 437/203 |
| 5,578,851 A | 11/1996 | Hshieh et al. | 257/330 |
| 5,581,100 A | 12/1996 | Ajit | 257/331 |
| 5,583,065 A | 12/1996 | Miwa | 437/41 |
| 5,592,005 A | 1/1997 | Floyd et al. | 257/331 |
| 5,593,909 A | 1/1997 | Han et al. | 437/41 |
| 5,595,927 A | 1/1997 | Chen et al. | 437/52 |
| 5,597,765 A | 1/1997 | Yilmaz et al. | 437/203 |
| 5,602,046 A | 2/1997 | Calafut et al. | 437/41 |
| 5,605,852 A | 2/1997 | Bencuya | 437/40 |
| 5,614,751 A | 3/1997 | Yilmaz et al. | 257/394 |
| 5,623,152 A | 4/1997 | Majumdar et al. | 257/330 |
| 5,629,543 A | 5/1997 | Hshieh et al. | 257/330 |
| 5,639,676 A | 6/1997 | Hshieh et al. | 437/40 |
| 5,648,670 A | 7/1997 | Blanchard | 257/329 |
| 5,656,843 A | 8/1997 | Goodyear et al. | 257/329 |
| 5,661,322 A | 8/1997 | Williams et al. | 257/331 |
| 5,665,619 A | 9/1997 | Kwan et al. | 438/270 |
| 5,665,996 A | 9/1997 | Williams et al. | 257/401 |
| 5,674,766 A | 10/1997 | Darwish et al. | 437/40 |
| 5,684,319 A | 11/1997 | Hebert | 257/336 |
| 5,684,320 A | 11/1997 | Kawashima | 257/351 |

| Patent | Date | Inventor | Class |
|---|---|---|---|
| 5,688,725 A | 11/1997 | Darwish et al. | 438/270 |
| 5,689,128 A | 11/1997 | Hshieh et al. | 257/331 |
| 5,693,569 A | 12/1997 | Ueno | 437/203 |
| 5,701,026 A | 12/1997 | Fujishima et al. | 257/510 |
| 5,705,409 A | 1/1998 | Witek | 437/35 |
| 5,710,072 A | 1/1998 | Krautschneider et al. | 438/197 |
| 5,717,237 A | 2/1998 | Chi | 257/315 |
| 5,719,084 A | 2/1998 | Mallon et al. | 438/783 |
| 5,719,409 A | 2/1998 | Singh et al. | 257/77 |
| 5,721,148 A | 2/1998 | Nishimura | 437/40 |
| 5,729,037 A | 3/1998 | Hshieh et al. | 257/329 |
| 5,733,810 A * | 3/1998 | Baba et al. | 438/268 |
| 5,741,396 A | 4/1998 | Loewenstein | 156/643.1 |
| 5,767,004 A | 6/1998 | Balasubramanian et al. | 438/592 |
| 5,767,550 A | 6/1998 | Calafut et al. | 257/355 |
| 5,770,514 A * | 6/1998 | Matsuda et al. | 438/589 |
| 5,770,878 A | 6/1998 | Beasom | 257/330 |
| 5,780,343 A | 7/1998 | Bashir | 438/269 |
| 5,783,491 A | 7/1998 | Nakamura et al. | 438/702 |
| 5,783,493 A | 7/1998 | Yeh et al. | 438/718 |
| 5,795,792 A | 8/1998 | Nishihara | 437/6 |
| 5,801,408 A | 9/1998 | Takahashi | 257/212 |
| 5,801,417 A | 9/1998 | Tsang et al. | 257/333 |
| 5,808,340 A | 9/1998 | Wollesen et al. | 257/330 |
| 5,814,858 A | 9/1998 | Williams | 257/328 |
| 5,818,084 A | 10/1998 | Williams et al. | 257/329 |
| 5,869,874 A | 2/1999 | Manning | 257/382 |
| 5,879,971 A | 3/1999 | Witek | 438/238 |
| 5,879,994 A | 3/1999 | Kwan et al. | 438/268 |
| 5,894,157 A | 4/1999 | Han et al. | 257/407 |
| 5,895,951 A | 4/1999 | So et al. | 257/330 |
| 5,895,952 A | 4/1999 | Darwish et al. | |
| 5,897,343 A * | 4/1999 | Mathew et al. | 438/133 |
| 5,897,374 A | 4/1999 | Lin | 438/666 |
| 5,915,180 A | 6/1999 | Hara et al. | 438/270 |
| 5,929,690 A | 7/1999 | Williams | 327/374 |
| 5,943,581 A | 8/1999 | Lu et al. | 438/386 |
| 5,945,724 A | 8/1999 | Parekh et al. | 257/510 |
| 5,959,324 A | 9/1999 | Kohyama | 257/301 |
| 5,972,741 A | 10/1999 | Kubo et al. | 438/138 |
| 5,973,360 A | 10/1999 | Tihanyi | 257/330 |
| 5,977,591 A | 11/1999 | Fratin et al. | 257/344 |
| 5,981,999 A | 11/1999 | Liu et al. | |
| 5,998,833 A | 12/1999 | Baliga | |
| 5,998,836 A | 12/1999 | Williams | |
| 5,998,837 A | 12/1999 | Williams | |
| 6,001,704 A | 12/1999 | Cheng et al. | 438/410 |
| 6,005,271 A | 12/1999 | Hshieh | 257/341 |
| 6,008,097 A | 12/1999 | Yoon et al. | 438/303 |
| 6,008,520 A | 12/1999 | Darwish et al. | 257/329 |
| 6,015,727 A | 1/2000 | Wanlass | 438/218 |
| 6,020,250 A | 2/2000 | Kenney | 438/422 |
| 6,037,202 A | 3/2000 | Witek | 438/212 |
| 6,037,628 A | 3/2000 | Huang | 257/329 |
| 6,037,632 A | 3/2000 | Omura et al. | 257/341 |
| 6,040,600 A | 3/2000 | Uenishi et al. | 257/330 |
| 6,049,108 A | 4/2000 | Williams et al. | |
| 6,051,468 A | 4/2000 | Hshieh | 438/270 |
| 6,051,488 A | 4/2000 | Lee et al. | |
| 6,057,558 A | 5/2000 | Yamamoto et al. | 257/77 |
| 6,060,745 A | 5/2000 | Tadokoro et al. | 257/329 |
| 6,066,878 A | 5/2000 | Neilson | 257/342 |
| 6,074,923 A | 6/2000 | Lee | 438/305 |
| 6,081,009 A | 6/2000 | Neilson | 257/341 |
| 6,084,264 A | 7/2000 | Darwish | |
| 6,084,268 A | 7/2000 | de Fresart et al. | |
| 6,087,232 A | 7/2000 | Kim et al. | 438/289 |
| 6,090,716 A * | 7/2000 | Floyd et al. | 438/700 |
| 6,091,115 A | 7/2000 | Ohtani et al. | 257/369 |
| 6,096,608 A | 8/2000 | Williams | |
| 6,096,629 A | 8/2000 | Tsai et al. | 257/570 |
| 6,097,061 A | 8/2000 | Liu et al. | 257/330 |
| 6,097,063 A | 8/2000 | Fujihira | 257/339 |
| 6,100,132 A | 8/2000 | Sato et al. | 438/243 |
| 6,103,578 A | 8/2000 | Uenishi et al. | 438/268 |
| 6,107,192 A | 8/2000 | Subrahmanyan et al. | 438/637 |
| 6,110,799 A | 8/2000 | Huang | 438/430 |
| 6,121,154 A | 9/2000 | Haselden et al. | |
| 6,133,587 A | 10/2000 | Takeuchi et al. | 257/77 |
| 6,156,606 A | 12/2000 | Michaelis | 438/243 |
| 6,156,611 A | 12/2000 | Lan et al. | 438/268 |
| 6,159,823 A | 12/2000 | Song et al. | 438/437 |
| 6,163,052 A | 12/2000 | Liu et al. | 257/334 |
| 6,168,983 B1 | 1/2001 | Rumennik et al. | 438/188 |
| 6,171,935 B1 | 1/2001 | Nance et al. | 438/489 |
| 6,174,785 B1 | 1/2001 | Parekh et al. | 438/424 |
| 6,184,545 B1 | 2/2001 | Werner et al. | 257/109 |
| 6,184,555 B1 | 2/2001 | Tihanyi et al. | 257/342 |
| 6,188,105 B1 | 2/2001 | Kocon et al. | 257/330 |
| 6,191,447 B1 | 2/2001 | Baliga | 257/330 |
| 6,198,127 B1 | 3/2001 | Kocon | 257/328 |
| 6,201,279 B1 | 3/2001 | Pfirsch | 257/333 |
| 6,204,097 B1 | 3/2001 | Shen et al. | 438/133 |
| 6,204,533 B1 | 3/2001 | Williams et al. | |
| 6,207,994 B1 | 3/2001 | Rumennik et al. | 257/342 |
| 6,222,229 B1 | 4/2001 | Hebert et al. | 257/327 |
| 6,225,649 B1 | 5/2001 | Minato | 257/133 |
| 6,228,727 B1 | 5/2001 | Lim et al. | 438/296 |
| 6,239,464 B1 | 5/2001 | Tsuchitani et al. | 257/330 |
| 6,265,269 B1 | 7/2001 | Chen et al. | 438/270 |
| 6,271,100 B1 | 8/2001 | Ballantine et al. | 438/424 |
| 6,271,153 B1 | 8/2001 | Moore | 438/787 |
| 6,271,562 B1 | 8/2001 | Deboy et al. | 257/341 |
| 6,277,706 B1 | 8/2001 | Ishikawa | 438/424 |
| 6,291,298 B1 | 9/2001 | Williams et al. | 438/270 |
| 6,291,856 B1 | 9/2001 | Miyasaka et al. | 257/335 |
| 6,294,818 B1 | 9/2001 | Fujihira | 257/409 |
| 6,297,534 B1 | 10/2001 | Kawaguchi et al. | 257/341 |
| 6,307,246 B1 | 10/2001 | Nitta et al. | 257/493 |
| 6,309,920 B1 | 10/2001 | Laska et al. | 438/202 |
| 6,313,482 B1 | 11/2001 | Baliga | 257/77 |
| 6,326,656 B1 | 12/2001 | Tihanyi | 257/288 |
| 6,337,499 B1 | 1/2002 | Werner | 257/329 |
| 6,346,464 B1 | 2/2002 | Takeda et al. | 438/514 |
| 6,346,469 B1 | 2/2002 | Greer | 438/614 |
| 6,351,018 B1 | 2/2002 | Sapp | 257/499 |
| 6,353,252 B1 | 3/2002 | Yasuhara et al. | 257/487 |
| 6,362,112 B1 | 3/2002 | Hamerski | 438/737 |
| 6,362,505 B1 | 3/2002 | Tihanyi | 257/329 |
| 6,365,462 B1 | 4/2002 | Baliga | 438/270 |
| 6,365,930 B1 | 4/2002 | Schillaci et al. | 257/339 |
| 6,368,921 B1 | 4/2002 | Hijzen et al. | 438/270 |
| 6,376,314 B1 | 4/2002 | Jerred | 438/270 |
| 6,384,456 B1 | 5/2002 | Tihanyi | 257/401 |
| 6,387,764 B1 | 5/2002 | Curtis et al. | 438/296 |
| 6,388,287 B1 | 5/2002 | Deboy et al. | 257/341 |
| 6,400,003 B1 | 6/2002 | Huang | 257/653 |
| 6,437,399 B1 | 8/2002 | Huang | 257/329 |
| 6,489,204 B1 * | 12/2002 | Tsui | 438/270 |
| 6,511,886 B1 * | 1/2003 | Kim et al. | 438/270 |
| 6,515,327 B1 * | 2/2003 | King | 257/304 |
| 6,566,224 B1 | 5/2003 | Chang et al. | 438/424 |
| 6,770,535 B1 * | 8/2004 | Yamada et al. | 438/270 |
| 2001/0028083 A1 | 10/2001 | Onishi et al. | 257/328 |
| 2001/0032998 A1 | 10/2001 | Iwamoto et al. | 257/330 |
| 2001/0041400 A1 | 11/2001 | Ren et al. | 438/200 |
| 2001/0050394 A1 | 12/2001 | Onishi et al. | 257/343 |
| 2002/0009832 A1 | 1/2002 | Blanchard | 438/142 |
| 2002/0013027 A1 * | 1/2002 | Hong et al. | 438/253 |
| 2002/0014658 A1 | 2/2002 | Blanchard | 257/330 |
| 2002/0066924 A1 | 6/2002 | Blanchard | 257/328 |
| 2002/0149047 A1 * | 10/2002 | Divakaruni et al. | 257/302 |
| 2003/0040174 A1 * | 2/2003 | Tan et al. | 438/638 |

FOREIGN PATENT DOCUMENTS

| | | |
|---|---|---|
| DE | 43 00 806 C1 | 12/1993 |
| EP | 0 238 749 | 9/1987 |
| EP | 0 550 770 | 7/1993 |
| EP | 0 583 028 | 2/1994 |
| EP | 0 698 919 | 2/1996 |
| EP | 0 720 235 | 7/1996 |
| EP | 0 720 236 | 7/1996 |
| EP | 0 746 030 | 12/1996 |
| EP | 0 747 967 | 12/1996 |
| EP | 0 755 076 | 1/1997 |
| EP | 0 795 911 | 9/1997 |
| EP | 0 801 425 | 10/1997 |
| EP | 0 975 024 | 1/2000 |
| GB | 2 269 050 | 1/1994 |
| JP | 56 131 960 | 10/1981 |
| JP | 57 018 365 | 1/1982 |
| JP | 57 153 469 | 9/1982 |
| JP | 58 137 254 | 8/1983 |
| JP | 58 210 678 | 12/1983 |
| JP | 59 080 970 | 5/1984 |
| JP | 59 193 064 | 11/1984 |
| JP | 60 028 271 | 2/1985 |
| JP | 61 102 782 | 5/1986 |
| JP | 62 012 167 | 1/1987 |
| JP | 62 016 572 | 1/1987 |
| JP | 62 023 171 | 1/1987 |
| JP | 62 046 569 | 2/1987 |
| JP | 62 179 482 | 8/1987 |
| JP | 63 114 173 | 5/1988 |
| JP | 63 288 047 | 11/1988 |
| JP | 1 94 672 | 4/1989 |
| JP | 5 226 661 | 9/1993 |
| JP | 5 251 387 | 9/1993 |
| JP | 6 163 910 | 6/1994 |
| JP | 8 204 194 | 8/1996 |
| JP | 8 250 731 | 9/1996 |
| JP | 8 316 479 | 11/1996 |
| JP | 9 036 362 | 2/1997 |
| JP | 9 102 607 | 4/1997 |
| JP | 9 270 512 | 10/1997 |
| JP | 2000 040 822 | 2/2000 |
| JP | 2000 040 872 | 2/2000 |
| JP | 2000 156 978 | 6/2000 |
| JP | 2000 277 726 | 10/2000 |
| JP | 2000 277 728 | 10/2000 |
| JP | 2001 015 448 | 1/2001 |
| JP | 2001 015 752 | 1/2001 |
| JP | 2001 102 577 | 4/2001 |
| JP | 2001 111 041 | 4/2001 |
| JP | 2001 135 819 | 5/2001 |
| JP | 2001 144 292 | 5/2001 |
| JP | 2001 244 461 | 9/2001 |
| JP | 2001 313 391 | 11/2001 |
| WO | WO 93/03502 | 2/1993 |
| WO | WO 95/34094 | 12/1995 |
| WO | WO 97/07547 | 2/1997 |
| WO | WO 97/16853 | 5/1997 |
| WO | WO 00/33386 | 6/2000 |
| WO | WO 00/68997 | 11/2000 |
| WO | WO 00/68998 | 11/2000 |
| WO | WO 01/06550 | 1/2001 |
| WO | WO 01/06557 | 1/2001 |
| WO | WO 01/45155 | 6/2001 |
| WO | WO 01/95398 | 6/2001 |
| WO | WO 01/59847 | 8/2001 |
| WO | WO 01/71815 | 9/2001 |
| WO | WO 01/95385 | 12/2001 |

OTHER PUBLICATIONS

U.S. Appl. No. 09/222,258, filed Dec. 28, 1998.
U.S. Appl. No. 09/267,921, filed Feb. 26, 1999.
U.S. Appl. No. 09/286,168, filed Apr. 5, 1999.
U.S. Appl. No. 09/343,330, filed Jun. 30, 1999.
U.S. Appl. No. 09/405,620, filed Sep. 24, 1999.
U.S. Appl. No. 09/448,884, filed Nov. 24, 1999.
U.S. Appl. No. 09/468,269, filed Dec. 20, 1999.
U.S. Appl. No. 09/640,496, filed Aug. 16, 2000.
U.S. Appl. No. 09/774,780, filed Jan. 30, 2001.
U.S. Appl. No. 09/782,343, filed Feb. 12, 2001.
Blanchard, "Optimization of Discrete High Power MOS Transistors," Stanford Electronics Laboratory, Integrated Circuits Laboratory, Technical Report No. IDEZ696-2 (Apr. 1982).
Chang et al., "A Highly Manufacturable Corner Rounding Solution for 0.18 μm Shallow Trench Isolation," IEDM Tech. Digest, pp. 661-664 (1997).
Chang, et al., "Numerical and Experimental Analysis of 500-V Power DMOSFET with an Atomic-Lattice Layout", 47th Annual Device Research Conference, Jun. 1989.
Chang, et al., "Self-Aligned UMOSFET's with a Specific On-Resistance of 1 m.OMEGA.cm.sup.2", IEEE Transactions on Electron Devices, Nov. 1987, pp. 2329-2334, vol. ED-34, No. 11.
Chang, T.S., et al, "Vertical FET Random-Access Memories with Deep Trench Isolation," IBM Technical Disclosure Bulletin, pp. 3683-3687 (Jan. 1980).
Geipel et al., "Composite Silicide Gate Electrodes—Interconnections for VLSI Device Technologies", Proceedings: IEEE Transactions on Electron Devices, vol. ED-27, No. 8, pp. 1417-1424, Aug. 1980.
Goodenough, "Dense MOSFET Enables Portable Power Control", Tech Insights, Electronic Design, Apr. 14, 1997.
Grant et al., "Power Mosfets: Theory and Applications," A. Wiley-Interscience Publication, COPYRGT. 1989, pp. 5-23. [ISBN 0-471-82867-X].
Ha D. et al., "Cell Transistor Design Using Self-Aligned Local Channel Implant (SALCI) for 4GB DRAMS and Beyond," International Conference on Solid State Devices and Materials, JA, Japan Society of Applied Physics, Tokyo, Sep. 1, 1997, pp. 514-515, XP00028217, figure 1.
Joshi, et al., "Study of the Growth Temperature Dependence of Performance and Reliability of Thin MOS Gate Oxides", Proceedings: IEEE Transactions of Electron Devices, vol. 39, No. 9, pp. 2099-2107, Sep. 1992.
Kao et al., "Two Dimensional Thermal Oxidation of Silicon-I. Experiments," IEEE Transactions on Electron Devices, vol. ED-34, No. 5, May 1987.
Kao et al., "Two Dimensional Thermal Oxidation of Silicon-II. Modeling Stress Effects in Wet Oxides," IEEE Transactions on Electron Devices, vol. ED-35, No. 1, Jan. 1988.
Kasai, et al., "Hot-Carrier-Degradation Characteristics for Flourine-Incorporated nMOSFET's" Proceedings: IEEE Transactions on Electron Devices, vol. 37, No. 6, pp. 1426-1431, Jun. 1990.
Lidow et al., "Power Mosfet Technology," (International Electron Devices meeting, Dec. 3-5, 1979, IEAM Technical Digest, pp. 79-83.
Lisiak et al., "Optimization of Nonplanar Power MOS Transistors," IEEE Transactions on Electron Devices, vol. ED-25, No. 10, pp. 1229-1234 (Oct. 1978).
Mahalingam et al., "The Graded Doped Power UMOSFET," Power Semiconductor Research Center Annual Report, pp. 68-71, North Carolina State University, 1968.
Mahalingam et al., "A Low Forward Drop High Voltage Trench MOS Barrier Schottky Rectifier with Linearly Graded Doping Profile," PRSC Document TR-97-030, Power Semiconductor Research Center, North Carolina State University, 1997.

Matsuda et al., "Novel Corner Rounding Process for Shallow Trench Isolation utilizing MSTS (Micro-Structure Transformation of Silicon)," IEDM Tech. Digest, pp. 137-140 (Dec. 1998).

Mena J. et al., "High Frequency Performance of VDMOS Power Transistors," International Electron Devices Meeting. Technical Digest, Washington, D.C., USA, Dec. 8-10, 1980, pp. 91-94, XP002148592 1980, N.Y., N.Y., USA, IEEE, USA, fig. 1.

Morisette, "Schottky Barrier Diodes", http://www.ecn.purdue.edu/WBG/Device_Research/Schottky_Diodes/Index.html, SiC Schottky Barrier Diode Development at Purdue.

Nandakumar et al., "Shallow Trench Isolation for advanced ULSI CMOS Technologies," IEDM Tech. Digest, pp. 133-136 (Dec. 1998).

Nouri et al., "An Optimized Shallow Trench Isolation for sub-0.18 μm ASIC Technologies," SPIE vol. 3506, pp. 156-166 (Sep. 1998).

Ou-Yang, "Double Ion Implanted V-MOS Technolgy," IEEE Journal of Solid-State Circuits, vol. SC-12, No. 1, pp. 3-10 (Feb. 1977).

Plummer, et al., Silicon VLSI Technology, 2000, pp. 612-649.

Salama et al., "Nonplanar Power Field-Effect Transistor," IEEE Transactions on Electron Devices, vol. ED-25, No. 10, pp. 1222-1228 (Oct. 1978).

Salama et al., "V Groove M.O.S. Transistor Technology," Electronic letters vol. 9, No. 19 (Sep. 20, 1973).

Salama et al., "VMOS—A New MOS Integrated Circuit Technology," Solid-State Electronics, vol. 17, pp. 791-797 (1974).

Singer, "Empty Spaces in Silicon (SS): An Alternative to SOI," Semiconductor International, Dec. 1999, p. 42.

Singer, "Metal Gates Could Replace Poly Gates for 0.1 μm Generation", Semiconductor International, Wafer Processing, Oct. 1997.

Sun, "Physics and Technology of Power MOSFETs," Stanford Electronics Laboratory, Integrated Circuits Laboratory, Technical Report No. IDEZ696-1 (Feb. 1982).

Sze, "P-N-Junction Diode" Physics of Semiconductor Devices Second Edition Bell Laboratories, pp. 63-108 (1981).

Ueda et al., "An Ultra-Low On-Resistance Power MOSFET Fabricated by Using a Fully Self-Aligned Process", IEEE Transactions on Electron Devices, Apr. 1987, pp. 926-930, vol. ED-34, No. 4.

Wolf, S., Silicon Processing for the VLSI Era, vol. 2, Lattice Press, p. 558, 1990.

Yagishita A. et al., "High Performance Metal Gate MOSFETS Fabricated by CMP for 0.1MUM Regime," International Electron Devices Meeting, US, N.Y., N.Y., IEEE, Dec. 6, 1998, pp. 785-788, XP000859487 ISBN: 0-7803-4775-7.

"CoolMOS.TM. C2 the second generation", Infineon.

"IR develops CoolMOS.TM.-equivalent technology, positions it at the top of a 3-tiered line of new products for SMPS", wysiwyg://79/http://www.irf.com/_FKK4aEd/whats-new/nr990403.ht, International Rectifier, Jul. 2000.

Technical Literature from Applied Materials, Farhad Moghadam, "Delivering Value Around New Industry Paradigms," pp. 1-11, vol. 2, Issue, Nov. 1999.

Technical Literature from Quester Technology, Model APT-4300 300mm Atmospheric TEOS/Ozone CVD System, no date.

Technical Literature from Quester Technology, Model APT-6000 Atmospheric TEOS-Ozone CVD Systems, no date.

Technical Literature from Semiconductor Fabtech, Curtis, et al., APCVD TEOS: O3 Advanced Trench Isolation Applications, 9th Edition, no date.

Technical Literature from Semiconductor International, John Baliga, Options for CVD of Dielectrics Include Low-k Materials, Jun. 1998.

Technical Literature from Silicon Valley Group Thermal Systems, APNext, High Throughout APCVD Cluster Tool for 200 mm/300 mm Wafer Processing, no date.

* cited by examiner

SELF-ALIGNED TRENCH MOSFETS AND METHODS FOR MAKING THE SAME

FIELD OF THE INVENTION

The invention generally relates to methods for fabricating integrated circuits (ICs) and semiconductor devices and the resulting structures. More particularly, the invention relates to metal oxide semiconductor field effect transistor (MOSFET) devices and methods for making such devices. Even more particularly, the invention relates to self-aligned trench MOSFET devices and methods for making such devices.

BACKGROUND OF THE INVENTION

There are numerous devices comprising silicon layers containing deep or high aspect ratio trenches. Forming such deep trenches in the silicon layer of these devices provides many novel and promising structures. The types of devices containing such trenches include the numerous types of silicon-based MEMS devices, as well ICs.

In IC fabrication, devices such as transistors may be formed on a semiconductor wafer or substrate, which is typically made of silicon. MOSFET devices are widely used in numerous applications, including automotive electronics, disk drives and power supplies. Generally, these devices function as switches, and they are used to connect a power supply to a load. It is important that the resistance of the device be as low as possible when the switch is closed. Otherwise, power is wasted and excessive heat may be generated.

One type of MOSFET is described in U.S. Pat. No. 6,084,268, the disclosure of which is incorporated herein by reference. In another type of MOSFET, the gate is formed in a trench. See, for example, U.S. Pat. Nos. 6,084,264, 5,998,833, 5,998,836, 5,998,837, 6,049,108, 6,051,488, 5,895,952, 6,204,533, and 6,090,716, the disclosures of which are incorporated herein by reference. An example of such a device is illustrated in FIGS. 1 and 2, with FIG. 1 depicting a cross-sectional view of a single cell of a MOSFET 100, and FIG. 2 depicting a plan view of the cell. Gates 102 and 104 are formed in trenches and surrounded by gate oxide layers 106 and 108, respectively. The trench gate is often formed in a grid pattern including an array of polygonal shapes (one section of which is shown in FIG. 2), the grid representing a single interconnected gate (gates 102 and 104 being the same). The trench gate may also be formed as a series of distinct parallel stripes.

MOSFET 100 is formed in an N-epitaxial layer 110. A N+ source region 112 is formed at the surface of epitaxial layer 110. A P+ contact region 114 is also formed at the surface of epitaxial layer 110. A P-body region 116 is located below N+ source region 112 and P+ contact region 114. A metal source contact 118 contacts the source region 112 and shorts the source region 112 to the P+ contact region 114 and P body region 116.

The N-epitaxial layer 110 is formed on a substrate 120, and a drain contact (not shown) is located at the bottom of the substrate 120. The contact for the gates 102 and 104 is likewise not shown, but it is generally made by extending the conductive gate material outside of the trench and forming a metal contact at a location remote from the individual cells. The gate is typically made of phosphorus or boron doped polysilicon.

A region 111 of N-epitaxial layer 110 between the substrate 120 and the P body 116 is generally more lightly doped with N-type impurities than substrate 120. This increases the ability of MOSFET 100 to withstand high voltages. Region 111 is sometimes referred to as a "lightly doped" or "drift" region ("drift" referring to the movement of carriers in an electric field). Drift region 111 and substrate 120 constitute the drain of MOSFET 100.

One feature making the trench configuration attractive is that the current flows vertically through the channel of the MOSFET. This permits a higher packing density than MOSFETs such as described in U.S. Pat. No. 6,084,268, where the current flows horizontally through the channel and then vertically through the drain. Greater cell density generally means more MOSFETs can be manufactured per unit area of the substrate and, therefore, a lower on-resistance ($R_{DS(on)}$) for the device. Increasing the cell density also allows the individual transistors to be closer together, requiring less area on a substrate or wafer and reducing the cost of manufacturing the device.

One problem standing in the way of increasing the cell density by manufacturing the transistors closer together is the alignment tolerance. The alignment tolerance is the amount of over-sizing needed to compensate for variations in the alignment. For example, as illustrated in FIG. 3, after the gate conductor 10 is placed in the trench 11, an isolation dielectric 4 is placed over the conductor 10 to electrically isolate the gate conductor from other conductive layers that will be placed on the substrate 12 during subsequent processing. Because the isolation dielectric 4 is only over the gate—and other selected—portions of the device, a masking and etching step using patterned photoresist mask 22 is employed to define the portions of the device where the isolation dielectric 4 need not be present, such as upper surface 13 of substrate 12. To compensate for the variations in the alignment of the trenches, an excess amount of the etched isolation dielectric 4A remains for adequate isolation, as depicted in FIG. 4. Because of this alignment tolerance 6, the transistors cannot be placed closer together and the cell density cannot be increased to yield the advantages mentioned above.

SUMMARY OF THE INVENTION

The present invention provides self-aligned trench MOSFETs and methods for manufacturing the same. By having a self-aligned structure, the number of MOSFETS per unit area—the cell density—is increased, increasing performance and making the MOSFETs cheaper to produce. The self-aligned structure for the MOSFET is provided by making the sidewall of the overlying isolation dielectric layer substantially aligned with the sidewall of the gate conductor. Such an alignment can be made through any number of methods such as using a dual dielectric process, using a selective dielectric oxidation process, using a selective dielectric deposition process, or a spin-on-glass dielectric process.

BRIEF DESCRIPTION OF THE DRAWINGS

FIGS. 1–18 are views of one aspect of the MOSFET and method of making the MOSFET according to the invention, in which:

FIGS. 1 and 2 illustrate a prior art MOSFET device;

FIGS. 3–4 illustrate how an alignment tolerance occurs during conventional processing;

FIGS. 5–12 illustrate the sequence of steps in one aspect of process of the invention;

FIGS. 13 and 14 illustrate the cross-sections A and B (respectively) of FIG. 12;

FIGS. 15–16 illustrate one aspect of forming an isolation cap according to the invention;

FIG. 17 illustrates another aspect of forming an isolation cap according to the invention; and FIG. 18 illustrates yet another aspect of forming an isolation cap according to the invention.

FIGS. 1–18 presented in conjunction with this description are views of only particular—rather than complete—portions of the MOSFET and method of making the MOSFET according to the invention.

DETAILED DESCRIPTION OF THE INVENTION

The following description provides specific details in order to provide a thorough understanding of the present invention. The skilled artisan, however, would understand that the present invention can be practiced without employing these specific details. Indeed, the present invention can be practiced by modifying the illustrated structure and method, and can be used in conjunction with apparatus and techniques conventionally used in the industry. For example, while the invention is described with reference to MOSFET devices, it could be modified for other devices formed in trenches which need to be isolated, such as bipolar devices, BDCMOS devices, or other types of transistor structures. As well, although the devices of the invention are described with reference to a particular type of conductivity (P or N), the devices can be configured with the opposite type of conductivity (N or P, respectively) by appropriate modifications.

Figure 1:
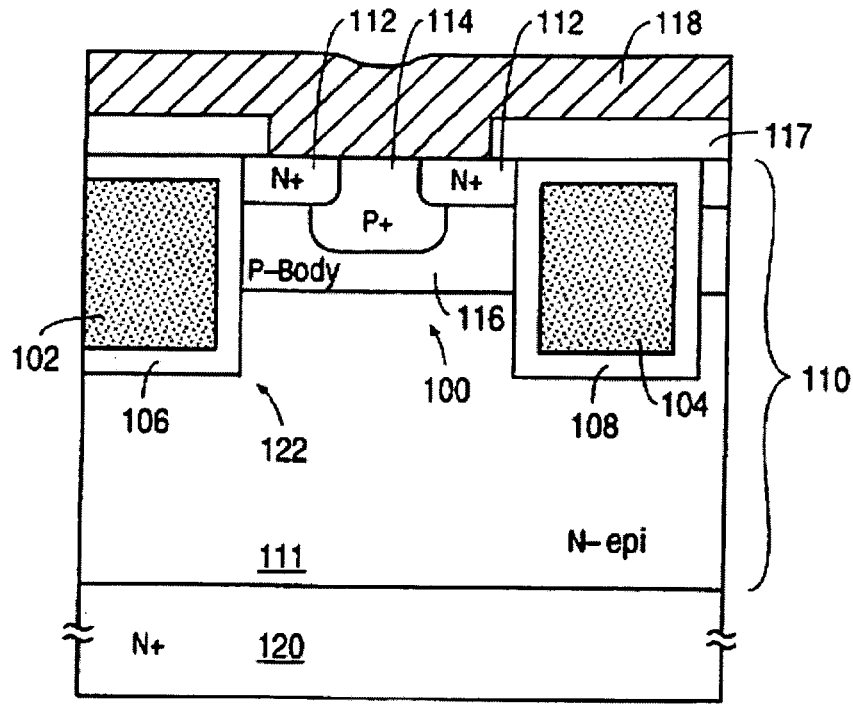
Figure 2:
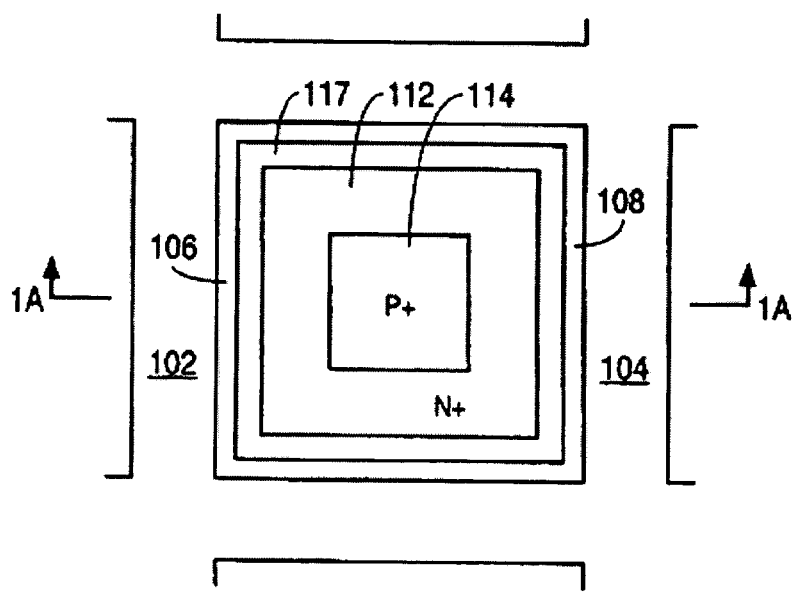
Figure 3:
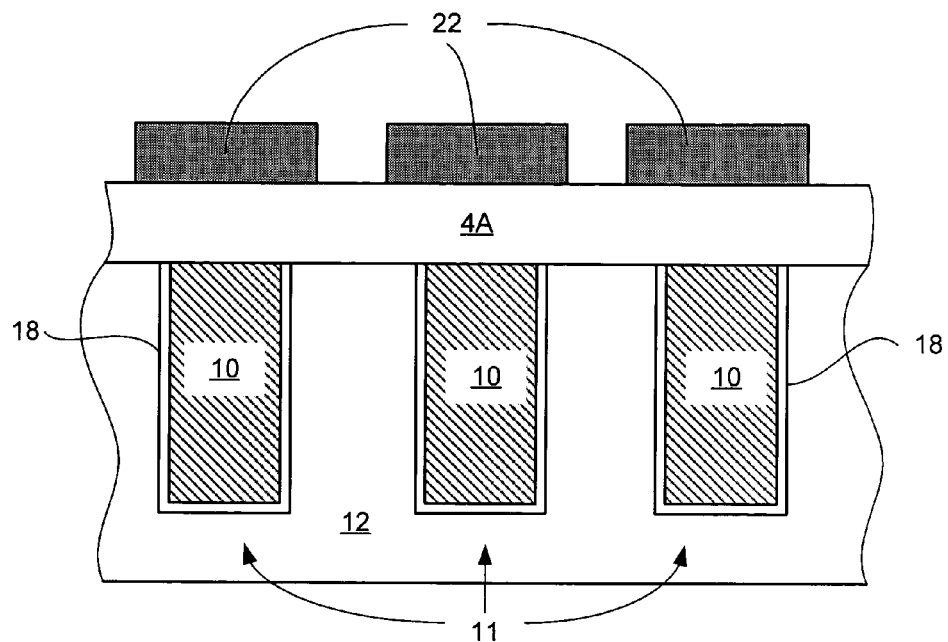
Figure 4:
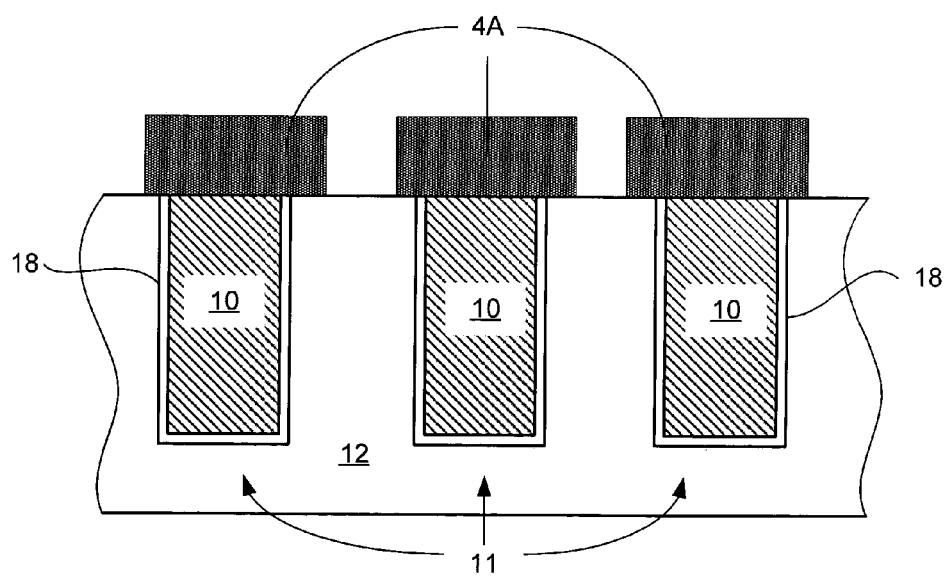
Figure 5:
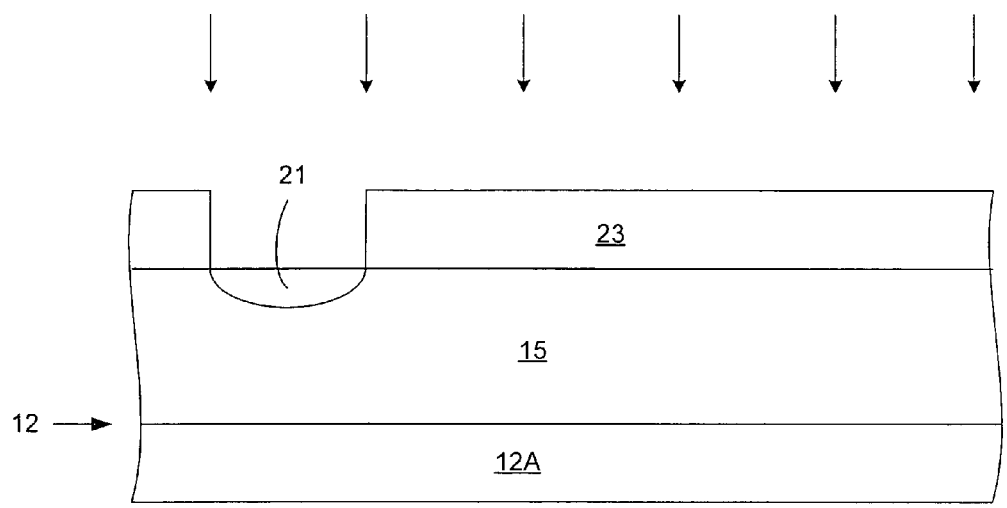

FIGS. 5–14 illustrate one aspect of the process for fabricating a MOSFET in accordance with this invention. Other processes resulting in substantially similar structures can, of course, be used in the invention. As shown in FIG. 5, the process begins with a substrate 12. Any substrate known in the art can be used in the invention. Suitable substrates include silicon wafers, epitaxial Si layers, polysilicon layers, bonded wafers such as used in silicon-on-insulator (SOI) technologies, and/or amorphous silicon layers, all of which may be doped or undoped.

In one aspect of the invention, the substrate 12 in the invention is a single crystal silicon wafer 12A having at least one epitaxial ("epi") Si layer 15 located in an upper region thereof. If desired, more than one epitaxial layer can be provided on the upper surface. The epitaxial layer(s) can be provided using any known process in the art, including any known epitaxial deposition process. The epitaxial layer(s) can remained undoped or can be doped with a desired dopant to the desired concentration using any suitable process known in the art.

Then, as illustrated in FIG. 5, a termination junction 20 is formed in an upper region of the epitaxial layer 15. Although any method known in the art can be used, the following process is used in the invention. A photoresist layer is deposited and then patterned as known in the art to form a patterned resist layer 23. The patterned resist layer 23 is then used as an implant mask during the implantation process used to create the termination junction. The implantation process forms a termination implant region 21 by implanting a suitable dopant to obtain the desired profile and concentration. Any dopant known in the art can be employed in the invention depending on the desired type of conductivity, e.g., P or N. Examples of suitable dopants include such as arsenic, boron, phosphorus, aluminum, antimony, beryllium, gallium, germanium, gold, magnesium, tellurium, tin, or a combination of these dopants. In one aspect of the invention, boron is implanted at an energy of about 30 to about 60 KeV with a dopant concentration of about $1 \times 10^{14}$ to about $5 \times 10^{15}$. The resist layer is then stripped using conventional processing, like a wet etch process using hot sulfuric acid and hydrogen peroxide.

Figure 6:
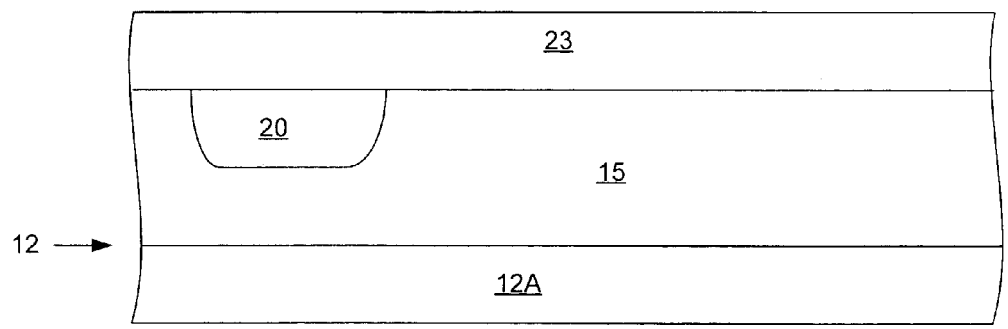

Next, as illustrated in FIG. 6, an oxide layer 24 is provided over the entire surface of the substrate 12. While any known process can be employed in the invention, the oxide layer 24 is preferably deposited by heating the substrate 12 in an oxidizing ambient such as oxygen or steam at 900–1100° C. Then, the dopant in the termination implant region 21 is driven into the substrate to form termination junction 20 to the desired depth, e.g., a depth of about 2,000 to about 10,000 angstroms. While any process obtaining this desired dopant profile can be used, the dopant is preferably driven by heat treatment in a furnace at a temperature of about 1000 to about 1100 degrees Celsius.

Figure 7:
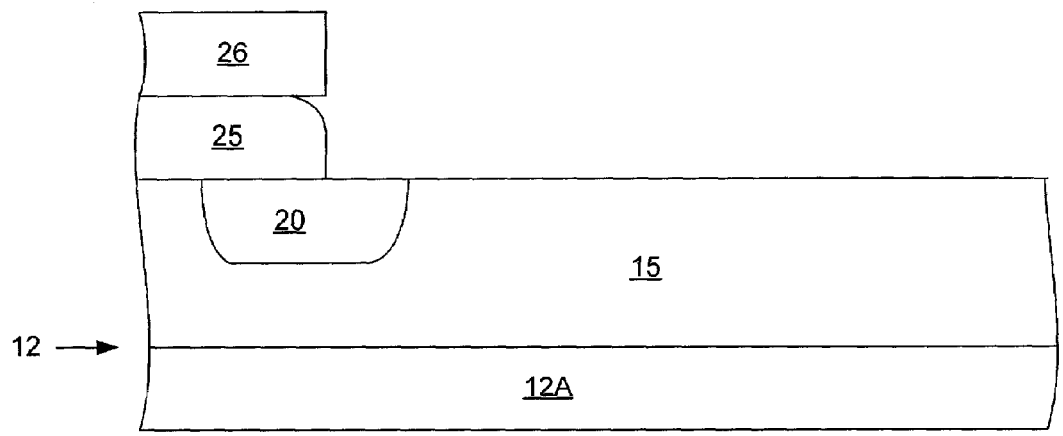

Next, as illustrated in FIG. 7, a field oxide 25 is provided from oxide layer 24. The field oxide 25 is patterned and etched from the active areas of the device using any known methods in the art. For example, a photoresist layer can be deposited and patterned. The resulting resist mask 26 is then used during an etching process to remove undesired portions of the oxide layer 24. The resist layer is then stripped using conventional processing, like a wet etch process using hot sulfuric acid and hydrogen peroxide.

Figure 8:
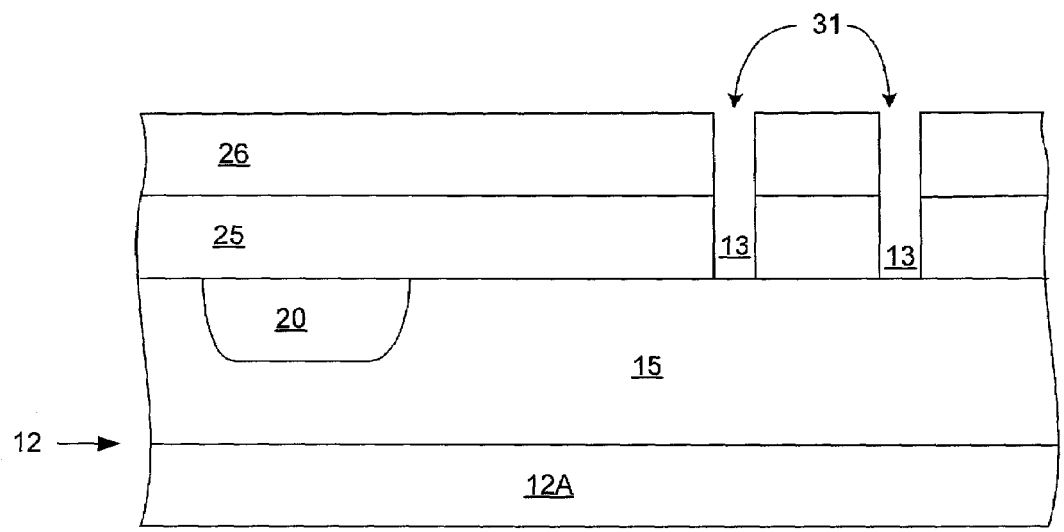
Figure 9:
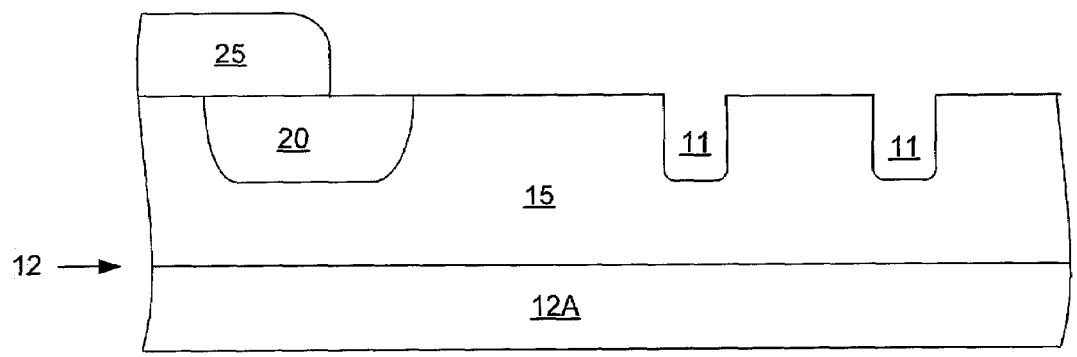

Next, as depicted in FIGS. 8 and 9, the trenches 11 in substrate 12 are made by a masking and etching process. Mask 24 can comprise either a single layer or multiple layers as known in the art. See, for example, U.S. Pat. Nos. 6,103,635 and 6,121,154, the disclosures of which are incorporated herein by reference. In one aspect of the invention, mask 24 can comprise, for example, any suitable photoresist material. The thickness and other characteristics of the photoresist are well known and can be optimized as known in the art.

As depicted in FIG. 8, mask 24 contains a pattern of openings 31 that expose the upper surface 13 of substrate 12. The openings 31 generally correspond to the locations where the trenches 11 will be formed. To form the openings, the mask 24 is patterned during a photolithographic process as known in the art. The patterning process removes portions of the photoresist material in the location of openings 31.

With openings 31 formed in mask 24, trenches 11 are then formed in substrate 12 using any suitable process known in the art. In one aspect of the invention, the trenches are formed via a chlorine-based etching process. The etching process begins by forming upper sidewall portions in the epitaxial silicon layer 15. The process then continues to produce lower sidewall portions and rounded bottom corners. In one aspect of the invention, the depth of the trenches can range from about 0.5 to about 3 microns. The parameters of the etching process are controlled to preferably form round bottom corners, smooth surfaces, and flat and clean trench bottom surfaces, thereby maintaining the integrity of the MOSFET device characteristics using the trenches.

After forming the trenches, the mask 24 is removed by any suitable process known in the art, resulting in the structure illustrated in FIG. 9. The photoresist material can be removed using a conventional stripping solution such as $H_2SO_4/H_2O_2$ or an $O_2$ ash. Following removal of resist mask 24, the epitaxial silicon layer 15 can be dipped in a diluted acidic solution to remove any polymer and/or passivation present in the trenches. Further cleaning can be performed as known in the art.

Figure 10:
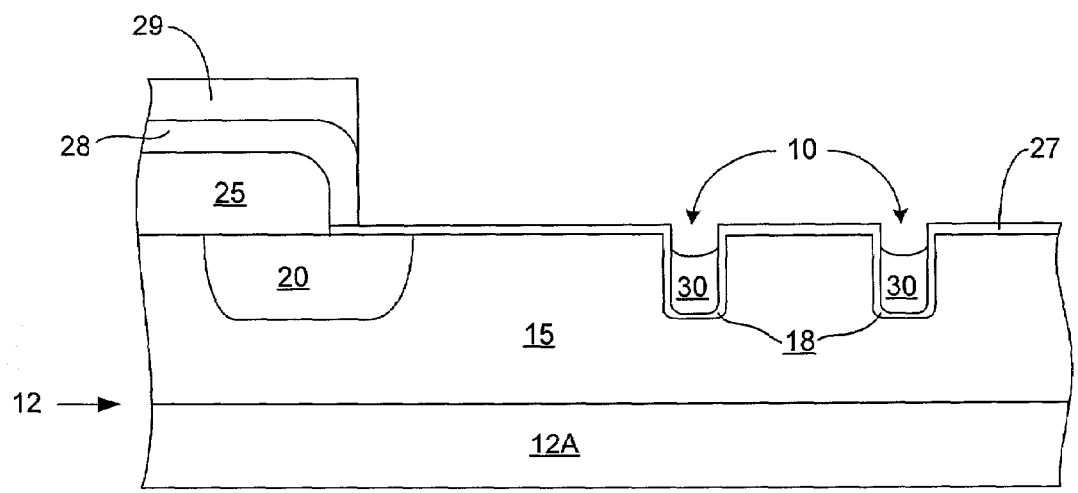
Figure 11:
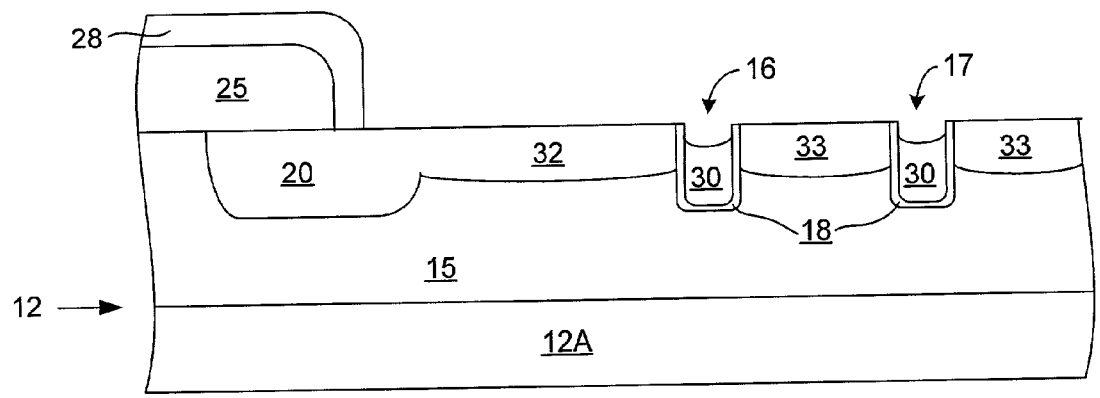
Figure 13:
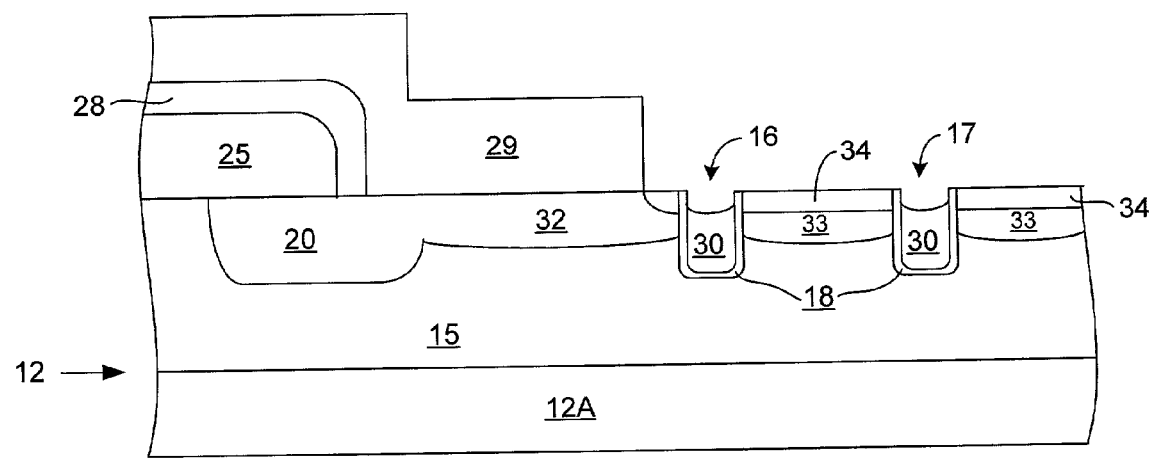

As shown in FIG. 10, an oxide layer 27 is then provided on the top surface of the structure, including the trench. This oxide will be used as gate oxide 18 and therefore must be of a high quality. Any suitable method known in the art—including oxidation and deposition—yielding a high quality oxide layer can be used to provide oxide layer 27. In one aspect of the invention, oxide layer 27 is provided by oxidation or deposition. The thickness of oxide layer 27 can range from about 30 to about 1000 angstroms.

Next, a conductive layer 28 is deposited to fill and overflow the remaining portions of the trench 11. This conductive layer 28 can be suitable material that can be used as a gate conductor 10, such as metal or polysilicon. In one aspect of the invention, the conductive layer is preferably polysilicon. The conductive layer 28 can be deposited using any known deposition process, including chemical vapor deposition process. Optionally, the conductive layer 28 can be doped with any suitable dopant to the desired concentration. In one aspect of the invention, such as when the conductive layer is polysilicon, the conductor layer is doped with P or B to a concentration of about $5 \times 10^{19}$ by ion implantation or thermal processing.

Excess (and unneeded) portions of the conductive layer 28 are then removed using a photoresist mask 29 to form gate conductor 10. In one aspect of the invention, enough of the conductive layer 28 is removed so the upper surface 30 of the resulting gate conductor 10 is lower than the upper surface 13 of the substrate 12. The distance between the upper surface 13 of the substrate 12 and the upper surface 30 of the gate conductor 10 can range from about 0.25 to about 0.8 microns, and in one aspect of the invention, is preferably about 0.5 microns. The excess portions of the conductive layer 28 can be removed through any process known in the art, such as a suitable etching process. The portions of the oxide layer 27 outside the trenches 11 can then be removed through any process known in the art, such as a suitable etching process. Then, the photoresist mask 29 is stripped as known in the art.

Next, as illustrated in FIGS. 11–14, implant region 32 and channel regions 33 are created in an upper region of substrate 12. In one aspect of the invention, any suitable doping process that will obtain the desired profile and concentration can be used to create the implant and channel regions. For example, such regions can be created by implanting P, As, or B at about 30 to about 80 KeV with a dose of about $3 \times 10^{13}$. If necessary, a mask can be used to limit the doping process to specific areas of the substrate. Then, the dopant is driven into the substrate by heating for about 20 to about 120 minutes at a temperature of about 1100 degrees Celsius.

Next, source region 34 is created in an upper region of substrate 12 near gates 16 and 17. In one aspect of the invention, the source region 34 can be created using any suitable doping process that will obtain the desired profile and concentration. For example, the source region can be created by implanting As, P, or B at about 80 KeV with a dose of about $1 \times 10^{16}$. A source mask 41 made of a suitable photoresist material is used to limit the doping process to those areas of the substrate where the source region will be created. After the doping process to create the source regions, the source mask is removed using any suitable stripping process. Then, the dopant is driven into the substrate by heating for about 60 minutes at a temperature of about 800 to about 1000 degrees Celsius.

Figure 12:
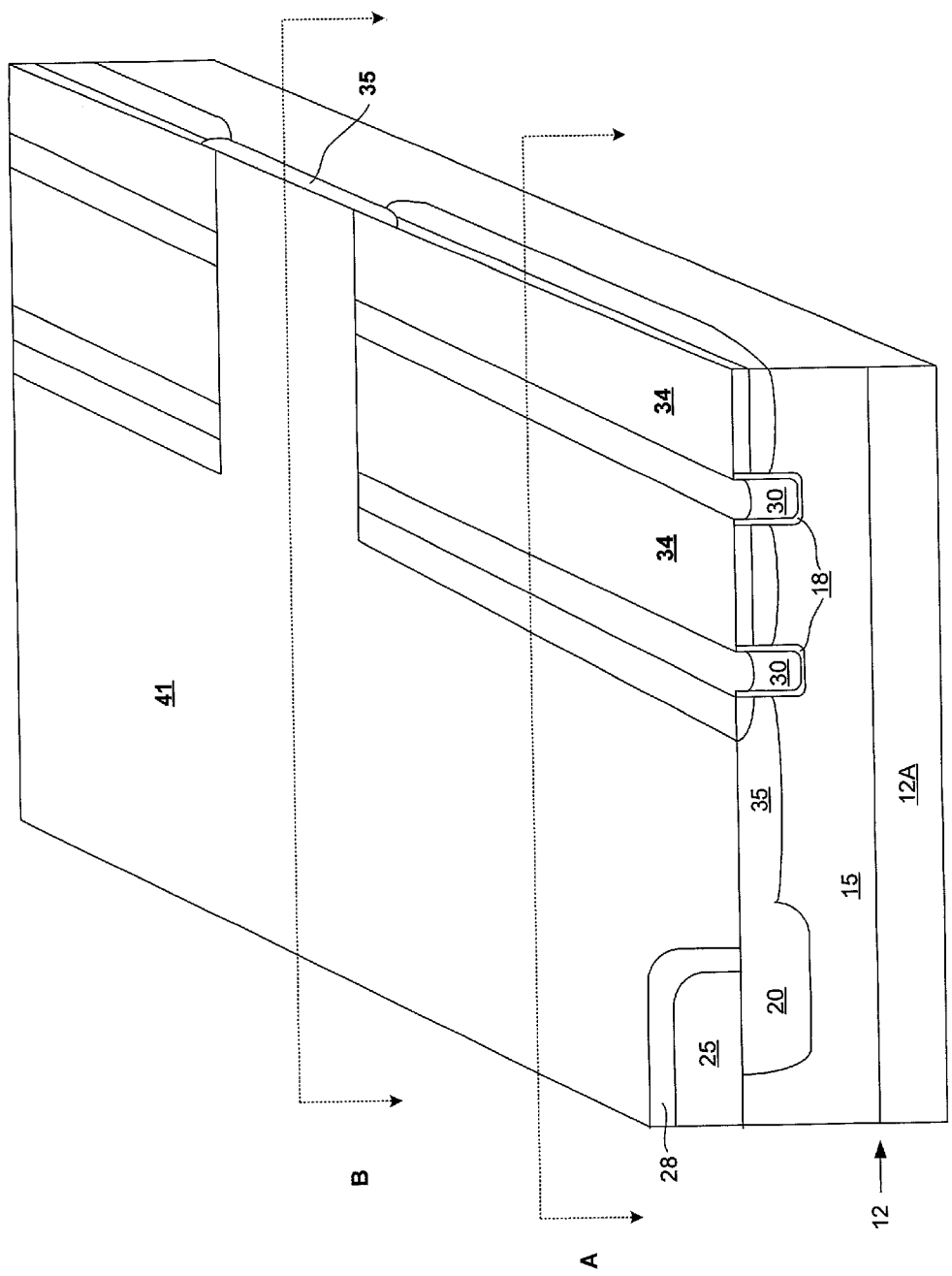
Figure 14:
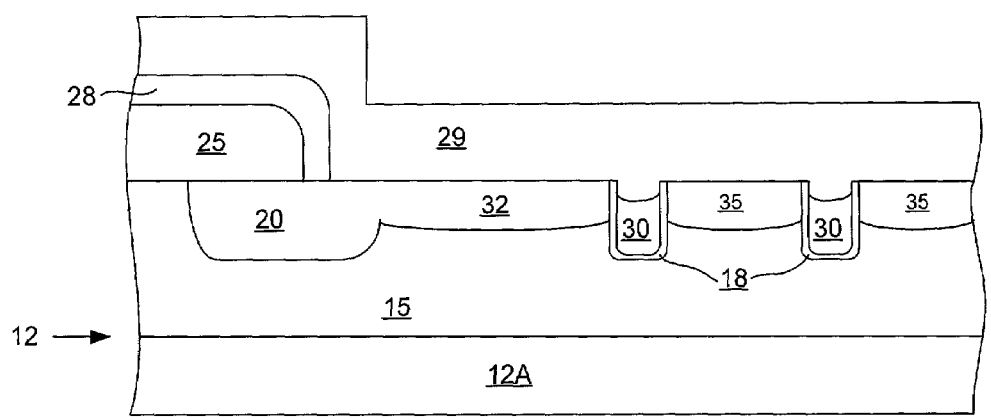

Next, as best depicted in FIG. 12, body contact region 35 is created in an upper region of substrate 12 and therefore in an upper region of implant region 32. In one aspect of the invention, the body contact region 35 can be created using any suitable doping process that will obtain the desired profile and concentration. For example, the body contact region can be created by implanting B, P, or As at about 40–100 KeV with a dose of about $1 \times 10^{14}$ to about $8 \times 10^{15}$. Then, the dopant is driven into the substrate by a standard furnace anneal or a rapid thermal anneal.

Figure 15:
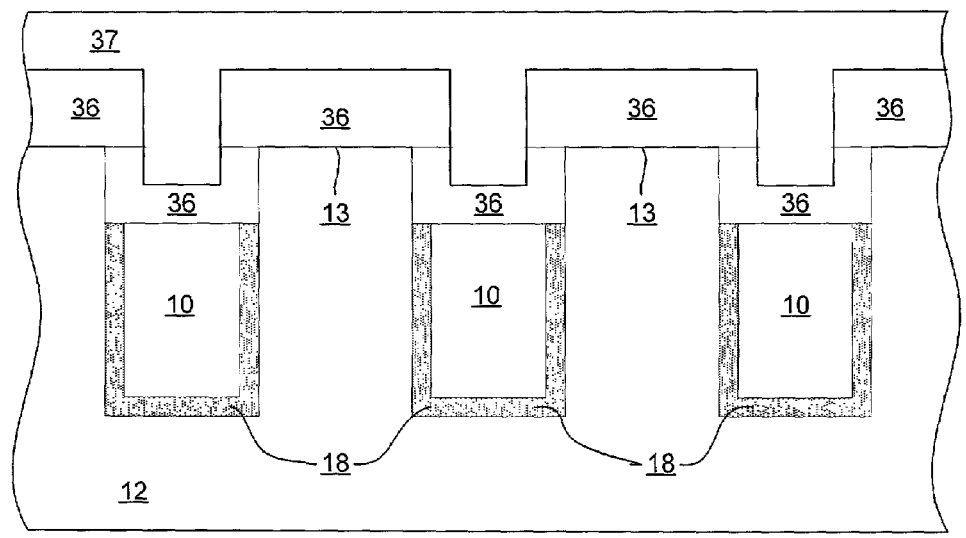
Figure 16:
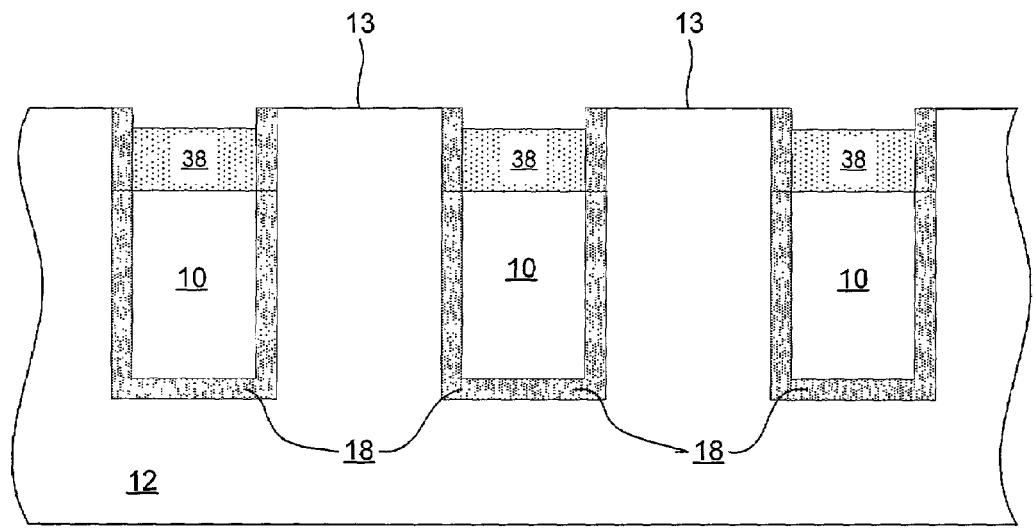

After the above steps have been performed, a self-aligned dielectric layer (or isolation cap 38) is provided over gate conductor 10. In one aspect of the invention, the isolation cap is created in the following manner, the "dual dielectric process." In this aspect of the invention, as shown in FIGS. 15 and 16, a first dielectric layer 36 is provided over the surface of the substrate 12. The first dielectric layer can be provided using any suitable process in the art, such as an oxidation or deposition process like PECVD. The first dielectric layer 36 can comprise any dielectric material such as PSG, BPSG, or an undoped LTO (low temperature oxide) layer. Preferably, the first dielectric layer is PSG.

The first dielectric layer 36 is doped so that it etches faster than the second dielectric layer 37 (described below). The first dielectric layer 36 can be doped after it is deposited or while it is being deposited (in situ). Preferably, when first dielectric layer 36 is made of PSG, it is doped with P to a concentration of about 1 to about 3%.

Next, a second dielectric layer 37 is provided over the surface of the first dielectric layer 36. The second dielectric layer 37 can be provided using any suitable process in the art such as a deposition process like PECVD. The second dielectric layer 37 can comprise any dielectric material such as PSG or BPSG. Preferably, the second dielectric layer is BPSG. The second dielectric layer (and accompanying dopant as described below) is also selected so that it reflows more readily than the first dielectric layer 36.

The second dielectric layer 37 is doped so that it etches shower than the first dielectric layer 36. The second dielectric layer can be doped after it is deposited or while it is being deposited (in situ). Preferably, when second dielectric layer 37 is made of BPSG, it is doped with B to a concentration of about 3–5% and P to a concentration of about 3–5%.

After both the first and second dielectric layers have been deposited, both dielectric layers are flowed. The flow process will create a planar upper surface for the dielectric layers, as depicted in FIG. 15. The flow process selected can be any known in the art that will create the substantially planar upper surface, like heating for 100 minutes at a temperature of about 850 to about 900 degrees Celsius.

Next, the first and second dielectric layers are removed to leave an isolation cap 38 in the trench on the gate conductor 10. The dielectric layers can be removed using any suitable process, such as an isotropic etching process using BOE or anisotropic etching processes such as a dry plasma etch. The etching process removes the dielectric layers from the regions where they need not be present, as well as leaves a substantially planar upper surface of isolation cap 38.

In a variation on this aspect of the invention, a single dielectric layer can be used instead of two dielectric layers. The single dielectric layer can be doped or undoped. The single dielectric layer is then flowed and isotropically etched in vertical direction until the upper surface of the substrate is exposed. The process in this variation leaves an isolation cap in the trench over the gate conductor because the thickness of the reflowed single dielectric layer is greater in the trench than outside the trench and the isotropic etch will remove the same amount of dielectric layer regardless of location.

Figure 17:
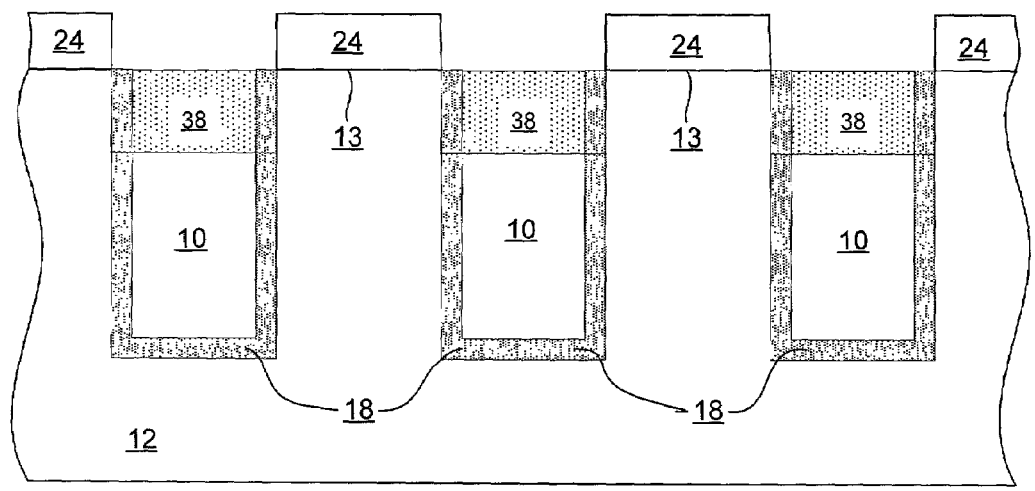

In another aspect of the invention, the isolation cap 38 is provided in an alternative manner, the "selective dielectric oxidation process." In this aspect of the invention, as shown in FIG. 17, the mask 24 used while etching the trenches in the substrate 12 is made of nitride. After forming the trenches 11, gate oxide 18, and gate conductor 10, a single dielectric layer is grown over the gate conductor 10. Preferably, the dielectric layer 39 is grown by oxidation. For example, this dielectric layer can be grown by oxidation in oxygen and hydrogen in a high-temperature oxidation furnace at a temperature of about 900 to about 1100 degrees Celsius for about 30 to about 90 minutes.

Because of the presence of mask 24 containing a nitride, the oxidation process does not oxidize portions of the substrate upper surface 13 other than in the trenches 11. Thus, after the oxidation process, the mask 24 containing the nitride can be removed by any suitable process, such as a wet etch using hot phosphoric acid. With mask 24 removed, isolation cap remains over gate conductor 10.

In another aspect of the invention, the isolation cap 38 is provided in yet another manner, the "selective dielectric deposition process." In this aspect of the invention, the mask 24 used while etching the trenches in the substrate 12 is again made of nitride. After forming the trenches 11, gate oxide 18, and gate conductor 10, a single dielectric layer is grown over the gate conductor 10. Preferably, the dielectric layer is selectively deposited by any suitable deposition process known in the art. For example, the dielectric layer can be deposited by SACVD and then flowing TEOS and ozone in a temperature of about 400 to about 500 degrees Celsius and a pressure ranging from about 200 to about 600 torr, thereby depositing a non-organic silicon dioxide layer containing only residual amounts of carbon atoms.

Because the deposition is a selective deposition process, the single dielectric layer is only deposited over gate conductor 10. Thus, after the deposition process, the mask 24 containing the nitride can be removed by any suitable process, such as a wet etch using hot phosphoric acid. With mask 24 removed, isolation cap remains over gate conductor 10.

Figure 18:
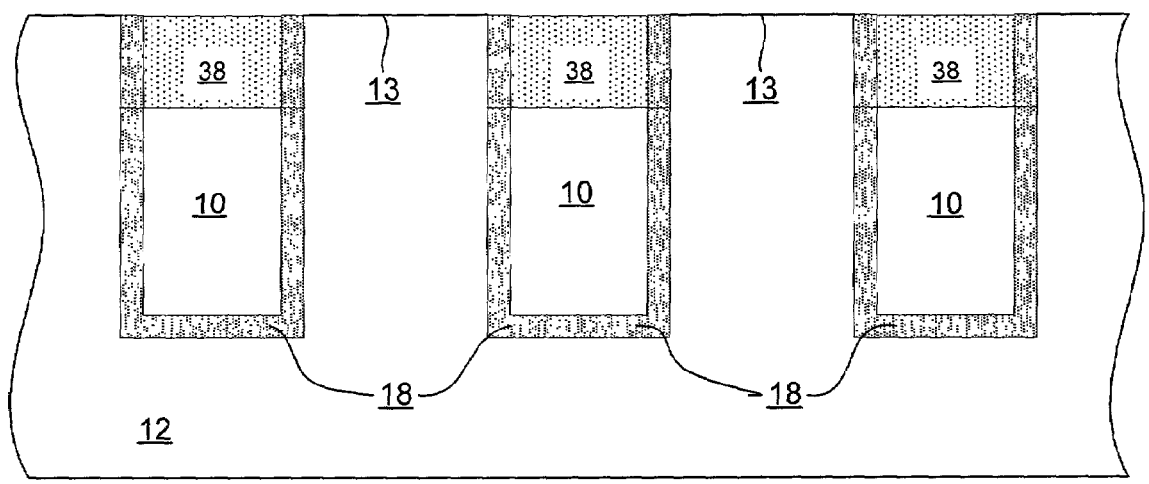

In another aspect of the invention, the isolation cap 38 is provided in still yet another manner, the "SOG dielectric process." In this aspect of the invention, as illustrated in FIG. 18, after the gate conductor 10 is formed by removing the desired portions of the conductive layer 28, an organic dielectric material such as spin-on-glass (SOG) layer is applied to the substrate as known in the art. See, for example, U.S. Pat. No. 6,090,716, the disclosure of which is incorporated herein by reference. The SOG layer is applied in such a manner so that the SOG remains in the trenches 11 to form the isolation cap 38. As well, the SOG can be applied so that it optionally remains on the portion of conductive layer 28 overlying the field oxide.

After the above processes are concluded, conventional processing can continue to finish the MOSFET devices. As well, other processing can continue to finish other processing needed to complete other parts of the semiconductor device.

Having described the preferred embodiments of the present invention, it is understood that the invention defined by the appended claims is not to be limited by particular details set forth in the above description, as many apparent variations thereof are possible without departing from the spirit or scope thereof.

We claim:

1. A method for making a semiconductor device, comprising:

providing a substrate with an upper surface, the substrate having a trench therein;

providing an oxide layer on a bottom and sidewall of the trench;

providing a conductive layer on a bottom and sidewall of the oxide layer, the conductive layer having an upper surface below the upper surface of the substrate; and providing a self-aligned isolation cap on the conductive layer within the trench, the isolation cap comprising a non-organic dielectric material, including providing the self-aligned isolation cap by providing a first dielectric layer, providing a second dielectric layer over the first dielectric layer, reflowing the second dielectric layer, and then anisotropically etching the first and second dielectric layers until the upper substrate surface is exposed.

2. The method of claim 1, including reflowing the second dielectric layer until an upper surface of the second dielectric layer is substantially planar.

3. The method of claim 1, wherein the conductive layer comprises polysilicon or metal.

4. The method of claim 1, wherein the self-aligned isolation cap comprises silicon oxide.

5. The method of claim 1, wherein the first dielectric material comprises PSG and the second dielectric material comprises BPSG.

6. A method for making a semiconductor device, comprising:

providing a semiconductor substrate with an upper surface, the substrate having a trench therein;

providing a gate oxide layer on a bottom and sidewall of the trench;

providing a conductive layer on a bottom and sidewall of the oxide layer, the conductive layer having an upper surface below the upper surface of the substrate; and providing a self-aligned isolation cap on the conductive layer and only within the trench by using a combination of dielectric materials with different etching rates.

7. The method of claim 6, wherein the dielectric materials comprises PSG, BPSG, or a low-temperature oxide.

8. The method of claim 6, wherein the different etching rates are provided by doping one or both of the dielectric materials.

9. The method of claim 7, wherein one of the dielectric materials comprises PSG and another dielectric material comprises BPSG.

10. The method of claim 6, wherein the conductive layer comprises polysilicon or metal.

11. A method for making a semiconductor device, comprising:

providing a substrate with an upper surface, the substrate having a trench therein;

providing an oxide layer on a bottom and sidewall of the trench;

providing a conductive layer on a bottom and sidewall of the oxide layer, the conductive layer having an upper surface below the upper surface of the substrate; and providing a self-aligned isolation cap on the conductive layer within the trench by using a combination of dielectric materials with different etching rates, including providing the self-aligned isolation cap by providing a first dielectric layer having a first etching rate in the trench and on the upper substrate surface, providing a second dielectric layer having an etching rate faster than the first etching rate on the first dielectric layer, reflowing the first and second dielectric layers, and then isotropically etching until the upper substrate surface is exposed.

12. The method of claim 11, including reflowing the first and second dielectric layers until the upper surface of the second dielectric layer is substantially planar.

13. The method of claim 11, wherein the first dielectric layer dielectric material comprises PSG, BPSG, or a low-temperature oxide.

14. The method of claim 11, wherein the second dielectric layer dielectric material comprises PSG or BPSG.

15. The method of claim 11, wherein the conductive layer comprises polysilicon or metal.

16. A method for making a semiconductor device, comprising:
    providing a semiconductor substrate with an upper surface;
    providing a nitride-containing layer on a first portion of the substrate upper surface;
    providing a trench in a second portion of the substrate, the second portion not containing the nitride-containing layer thereon;
    providing a gate oxide layer on a bottom and sidewall of the trench;
    providing a conductive layer on a bottom and sidewall of the oxide layer, the conductive layer having an upper surface below the upper surface of the substrate;
    providing a self-aligned isolation cap on the conductive layer within the trench; and
    removing the nitride-containing layer.

17. The method of claim 16, wherein the upper surface of the conductive layer and the substrate upper surface are separated by about 0.5 microns.

18. The method of claim 16, the conductive layer comprising polysilicon.

19. The method of claim 18, including providing the self-aligned isolation cap by oxidizing the upper surface of the conductive polysilicon layer.

20. The method of claim 16, including providing the self-aligned isolation cap by selectively depositing a dielectric layer on the upper surface of the conductive layer.

21. The method of claim 16, wherein the conductive layer comprises polysilicon or metal.

22. A method for making a MOSFET, comprising:
    providing a semiconductor substrate with an upper surface, the substrate having a trench therein;
    providing source and channel regions proximate the trench;
    providing a gate oxide on a bottom and sidewall of the trench;
    providing a conductive gate on a bottom and sidewall of the gate oxide, the conductive gate having an upper surface below the upper surface of the substrate; and
    providing a self-aligned isolation cap on the conductive gate within the trench by using a combination of dielectric materials with different etching rates.

23. A method for making a MOSFET, comprising:
    providing a substrate with an upper surface, the substrate having a trench therein;
    providing source and channel regions proximate the trench;
    providing a gate oxide on a bottom and sidewall of the trench;
    providing a conductive gate on a bottom and sidewall of the gate oxide, the conductive gate having an upper surface below the upper surface of the substrate; and
    providing a self-aligned isolation cap on the conductive gate within the trench by using a combination of dielectric materials with different etching rates, including providing the self-aligned isolation cap by providing a first dielectric layer having a first etching rate in the trench and on the upper substrate surface, providing a second dielectric layer having an etching rate faster than the first etching rate on the first dielectric layer, reflowing the first and second dielectric layers, and then isotropically etching until the upper substrate surface is exposed.

24. A method for making a MOSFET, comprising:
    providing a semiconductor substrate with an upper surface;
    providing source and channel regions in the substrate;
    providing a nitride-containing layer on a first portion of the substrate upper surface;
    providing a trench in a second portion of the substrate, the second portion not containing the nitride-containing layer thereon;
    providing a gate oxide on a bottom and sidewall of the trench;
    providing a conductive gate on a bottom and sidewall of the gate oxide, the conductive gate having an upper surface below the upper surface of the substrate;
    providing a self-aligned isolation cap on the conductive gate within the trench; and
    removing the nitride-containing layer.

* * * * *

UNITED STATES PATENT AND TRADEMARK OFFICE
CERTIFICATE OF CORRECTION

PATENT NO. : 7,078,296 B2
APPLICATION NO. : 10/052234
DATED : July 18, 2006
INVENTOR(S) : Duc Chau et al.

It is certified that error appears in the above-identified patent and that said Letters Patent is hereby corrected as shown below:

Col 2, Line 32, delete "13" from "surface 13"

Col 3, Line 49, replace "remained" with --remain--

In The Drawings

Figure 6, replace numeral "23" with the numeral --24--

UNITED STATES PATENT AND TRADEMARK OFFICE
CERTIFICATE OF CORRECTION

PATENT NO.        : 7,078,296 B2                                           Page 2 of 2
APPLICATION NO.   : 10/052234
DATED             : July 18, 2006
INVENTOR(S)       : Duc Chau et al.

It is certified that error appears in the above-identified patent and that said Letters Patent is hereby corrected as shown below:

Figure 8, replace numerals "25" and "26" with the numeral --24-- as shown below:

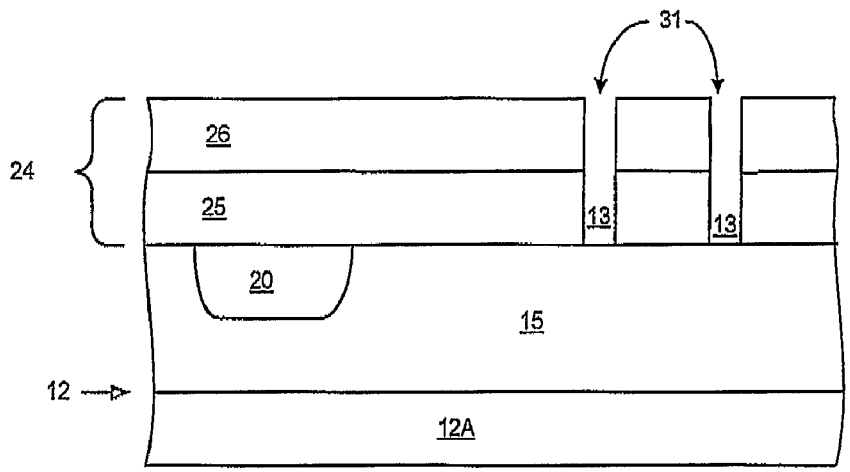

FIGURE 8

Signed and Sealed this

Twenty-second Day of May, 2007

JON W. DUDAS
*Director of the United States Patent and Trademark Office*